United States Patent
Antunez et al.

(10) Patent No.: US 10,541,346 B2
(45) Date of Patent: Jan. 21, 2020

(54) HIGH WORK FUNCTION MOO₂ BACK CONTACTS FOR IMPROVED SOLAR CELL PERFORMANCE

(71) Applicant: International Business Machines Corporation, Armonk, NY (US)

(72) Inventors: Priscilla D. Antunez, Tarrytown, NY (US); Douglas M. Bishop, New York, NY (US); Gloria W. Fraczak, Bellerose, NY (US); Oki Gunawan, Westwood, NJ (US); Richard A. Haight, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 15/425,717

(22) Filed: Feb. 6, 2017

(65) Prior Publication Data
US 2018/0226524 A1 Aug. 9, 2018

(51) Int. Cl.
*H01L 31/072* (2012.01)
*H01L 31/18* (2006.01)
*H01L 31/032* (2006.01)

(52) U.S. Cl.
CPC ........ *H01L 31/072* (2013.01); *H01L 31/0326* (2013.01); *H01L 31/18* (2013.01)

(58) Field of Classification Search
CPC ..... H01L 31/022433; H01L 31/022441; H01L 31/022466; H01L 31/0326; H01L 31/072; H01L 31/18
See application file for complete search history.

(56) References Cited

U.S. PATENT DOCUMENTS 6,818,530 B2 * 11/2004 Shimoda ............. G02F 1/13454
438/455
8,426,241 B2 4/2013 Ahmed et al.
(Continued)

FOREIGN PATENT DOCUMENTS

CN 103390674 A * 11/2013

OTHER PUBLICATIONS

"How to eliminate air from adhesive and remove air from a bond joint", retrieved from https://www.permabond.com/2016/12/16/eliminate-air-adhesive-remove-air-bond-joint// (Year: 2016).*
(Continued)

*Primary Examiner* — Mayla Gonzalez Ramos
(74) *Attorney, Agent, or Firm* — Vazken Alexanian; Michael J. Chang, LLC

(57) ABSTRACT

Improved high work function back contacts for solar cells are provided. In one aspect, a method of forming a solar cell includes: forming a completed solar cell having a substrate coated with an electrically conductive material, an absorber disposed on the electrically conductive material, a buffer layer disposed on the absorber, a transparent front contact disposed on the buffer layer, and a metal grid disposed on the transparent front contact; removing the substrate and the electrically conductive material using exfoliation, exposing a backside surface of the solar cell; depositing a high work function material onto the back side surface of the solar cell; and depositing a back contact onto the high work function material. A solar cell formed by the present techniques is also provided. Yield of the exfoliated device can be improved by removing bubbles from adhesive used for exfoliation and/or forming contact pads to access the metal grid.

17 Claims, 7 Drawing Sheets

(56) References Cited

U.S. PATENT DOCUMENTS

| | | | |
|---|---|---|---|
| 2009/0041930 A1 | 2/2009 | Zijp et al. | |
| 2010/0080914 A1* | 4/2010 | Forrest | H01L 51/0021 427/259 |
| 2010/0269907 A1 | 10/2010 | Lackner et al. | |
| 2011/0030774 A1* | 2/2011 | Cornfeld | H01L 31/022441 136/256 |
| 2011/0186115 A1* | 8/2011 | Wanlass | H01L 31/06875 136/255 |
| 2012/0100663 A1 | 4/2012 | Bojarczuk et al. | |
| 2013/0037110 A1 | 2/2013 | Mitzi et al. | |
| 2013/0037111 A1 | 2/2013 | Mitzi et al. | |
| 2013/0153025 A1* | 6/2013 | Hahn | H01L 31/02366 136/256 |
| 2013/0164882 A1 | 6/2013 | Afzali-Ardakani et al. | |
| 2013/0269764 A1 | 10/2013 | Barkhouse et al. | |
| 2014/0026949 A1 | 1/2014 | Ahmed et al. | |
| 2014/0352751 A1* | 12/2014 | Wu | H01L 31/0725 136/244 |
| 2015/0093852 A1* | 4/2015 | Jeong | H01L 31/022441 438/98 |
| 2015/0303326 A1* | 10/2015 | Cheng | H01L 31/0749 136/256 |
| 2016/0020352 A1 | 1/2016 | Konstantatos et al. | |
| 2016/0204304 A1 | 7/2016 | Gunawan et al. | |
| 2017/0012147 A1* | 1/2017 | Cheong | H01L 31/022466 |

OTHER PUBLICATIONS

Machine translation of CN-103390674-A, Luo et al. (Year: 2013).*
Shin et al., "Control of an interfacial MoSe2 layer in Cu2ZnSnSe4 thin film solar cells: 8.9% power conversion efficiency with a TiN diffusion barrier," Applied Physics Letters 101, 053903-1-4 (Jul. 2012).
Pachauri et al., "Chemically exfoliated large-areatwo-dimensional flakes of molybdenum disulfide for device applications," Apl Materials 1, 032102 (Sep. 2013) (10 pages).
Hegedus et al., "CdTe contacts for CdTe/CdS solar cells: effect of Cu thickness, surface preparation and recontacting on device performance and stability," Solar Energy Materials & Solar Cells 88, 75-79 (Jun. 2005).
Dullweber et al., "Back surface band gap gradings in Cu(In,Ga)Se2 solar cells," Thin Solid Films, vol. 387, 11-13 (May 2001).
Wang et al., "Device Characteristics of CZTSSe Thin-Film Solar Cells with 12.6% Efficiency," Adv. Energy. Mater. (Nov. 2013) (5 pages).
K.F. Tai et al., "Fill Factor Losses in Cu2ZnSn (SxSe1-x)4 Solar Cells: Insights from Physical and Electrical Characterization of Devices and Exfoliated Films," Advanced Energy Materials, vol. 6, No. 3, 1501609, 2016 (published Nov. 2015) (10 pages).
X. Li et al., "8.6% Efficiency CZTSSe solar cell with atomic layer deposited Zn—Sn—O buffer layer," Solar Energy Materials and Solar Cells, vol. 157, Dec. 2016, pp. 101-107.
S. Lopez-Marino et al., "The importance of back contact modification in Cu2ZnSnSe4 solar cells: The role of a thin MoO2 layer," Nano Energy, vol. 26, Jun. 2016, pp. 708-721.

* cited by examiner

HIGH WORK FUNCTION MOO₂ BACK CONTACTS FOR IMPROVED SOLAR CELL PERFORMANCE

STATEMENT OF GOVERNMENT RIGHTS

This invention was made with Government support under Contract number DE-EE0006334 awarded by Department of Energy. The Government has certain rights in this invention.

FIELD OF THE INVENTION

The present invention relates to solar cells, and more particularly, to high work function back contacts for solar cells to improve performance.

BACKGROUND OF THE INVENTION

Materials containing copper (Cu), zinc (Zn), tin (Sn), and at least one of sulfur (S) and selenium (Se) such as $Cu_2ZnSn(S,Se)_4$ (CZT(S,Se)) are earth-abundant and can be used as light absorbing materials in solar cells. In fact, solar cells made with CZT(S,Se) as the light absorbing layer are very attractive due to the material's stability and low toxicity. However, CZTSSe suffers from large voltage deficits (band gap—open circuit voltage Voc) that can affect device performance.

Thus, CZT(S,Se)-based solar cells and techniques for formation thereof that produce improved device performance and yield would be desirable.

SUMMARY OF THE INVENTION

The present invention provides high work function back contacts for solar cells to improve performance. In one aspect of the invention, a method of forming a solar cell is provided. The method includes: forming a completed solar cell having a substrate coated with an electrically conductive material, an absorber disposed on the electrically conductive material, a buffer layer disposed on the absorber, a transparent front contact disposed on the buffer layer, and a metal grid disposed on the transparent front contact; removing the substrate and the electrically conductive material using exfoliation, exposing a backside surface of the solar cell; depositing a high work function material onto the back side surface of the solar cell; and depositing a back contact onto the high work function material.

In another aspect of the invention, a solar cell is provided. The solar cell includes: a back contact; a high work function material disposed on the back contact; an absorber disposed on the high work function material; a buffer layer disposed on the absorber; a transparent front contact disposed on the buffer layer; and a metal grid disposed on the transparent front contact.

A more complete understanding of the present invention, as well as further features and advantages of the present invention, will be obtained by reference to the following detailed description and drawings.

DETAILED DESCRIPTION OF PREFERRED EMBODIMENTS

As provided above, conventional CZT(S,Se)-based solar cells suffer from large open circuit voltage (Voc) deficits. Advantageously, provided herein are back contact engineering techniques for CZT(S,Se)-based solar cells that address these voltage deficits to vastly improve device performance and yield.

As will be described in detail below, a high work function (back contact) material (such as molybdenum dioxide ($MoO_2$)) is deposited at the back of the CZT(S,Se)-based solar cell. During operation, electrons are driven away (electron mirror) from this back contact and toward the p-n junction by an electrostatic field created by the high work function back contact. As will be described in detail below, this effect vastly improves device performance and yield. By way of example only, the term "high work function" as used herein refers to a material having a work function of greater than about 5.2 eV, and preferably a work function of greater than about 5.5 eV.

The term "CZT(S,Se)-based solar cell," as used herein, refers to a solar cell that uses a material containing copper (Cu), zinc (Zn), tin (Sn), and at least one of sulfur (S) and selenium (Se), abbreviated herein as "CZT(S,Se)," such as $Cu_2ZnSn(S,Se)_4$) as a light absorbing layer (or simply "absorber"). A buffer layer (see below) forms a p-n junction with the absorber.

The present techniques are now provided by way of reference to FIGS. 1-9. In general, the present techniques involve first constructing a complete CZT(S,Se)-based solar cell, and then using an exfoliation process to remove the completed solar cell from its original substrate (the substrate on which the solar cell is fabricated), exposing a back side surface of the solar cell onto which the high work function back contact can then be formed.

Forming a complete photovoltaic device at the outset of the process enables one to employ all of the steps needed to produce a high quality device, such as building the device on a molybdenum (Mo)-coated soda-lime glass (SLG) substrate (as described see below) which is beneficial in terms of coefficient of thermal expansion (CTE) matching between the device and the substrate, permits the formation of beneficial secondary compounds such as $MoS_2$ and/or $MoSe_2$, etc. See, for example, Shin et al., "Control of an interfacial $MoSe_2$ layer in $Cu_2ZnSnSe_4$ thin film solar cells: 8.9% power conversion efficiency with a TiN diffusion barrier," Applied Physics Letters 101, 053903-1-4 (July 2012), the contents of which are incorporated by reference as if fully set forth herein.

Figure 1:
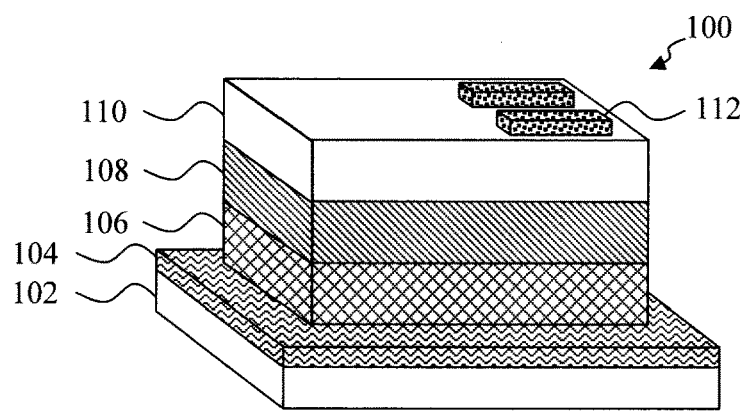
FIG. 1 is a cross-sectional diagram illustrating a completed solar cell having been fabricated on a substrate according to an embodiment of the present invention.

Thus, to begin the process, a completed solar cell 100 is formed as shown in FIG. 1. As shown in FIG. 1, solar cell 100 includes a substrate 102 coated with a layer (or multiple layers) of an electrically conductive material 104, an absorber 106 disposed on the layer of electrically conductive material 104, a buffer layer 108 disposed on the absorber 106, a transparent front contact 110 disposed on the buffer layer 108, and a metal grid 112 disposed on the transparent front contact 110.

Suitable substrates include, but are not limited to, soda lime glass (SLG), ceramic, metal foil, or plastic substrates. Suitable electrically conductive materials 104 include, but are not limited to, molybdenum (Mo), nickel (Ni), tantalum (Ta), tungsten (W), aluminum (Al), platinum (Pt), titanium nitride (TiN), silicon nitride (SiN), and combinations thereof. According to an exemplary embodiment, the electrically conductive material 104 has a thickness of from about 100 nanometers (nm) to about 500 nm, and ranges therebetween.

According to an exemplary embodiment, solar cell 100 is a CZT(S,Se)-based solar cell. In that case, the absorber 106 is a CZT(S,Se) absorber which, as provided above, includes Cu, Zn, Sn, and at least one of S and Se. According to an exemplary embodiment, the absorber 106 has a thickness of from about 0.5 μm to about 2 μm, and ranges therebetween.

Buffer layer 108 forms a p-n junction with the absorber 106. Suitable materials for the buffer layer 108 include, but are not limited to, cadmium sulfide (CdS), a cadmium-zinc-sulfur material of the formula $Cd_{1-x}Zn_xS$ (wherein $0<x\leq1$), indium sulfide ($In_2S_3$), zinc oxide, zinc oxysulfide (e.g., a Zn(O,S) or Zn(O,S,OH) material), and/or aluminum oxide ($Al_2O_3$). According to an exemplary embodiment, the buffer layer 108 has a thickness of from about 100 angstroms (Å) to about 1,000 Å, and ranges therebetween.

Suitable materials for the transparent front contact 110 include, but are not limited to, transparent conductive oxides (TCOs) such as indium-tin-oxide (ITO) and/or aluminum (Al)-doped zinc oxide (ZnO) (AZO)). Metal grid 112 serves as a top contact of the solar cell. Suitable materials for forming the metal grid 112 include, but are not limited to, nickel (Ni) and/or aluminum (Al). An exemplary process for forming solar cell 100 is provided in conjunction with the description of FIG. 10, below.

In order to improve device yield, it is preferable to next extend the contacts of the solar cell. Specifically, successfully accessing the various contacts of the completed solar cell (e.g., the metal grid 112 top contact, the back contact (see below), etc.) can be challenging, and any misalignment can produce a low-performing or non-working device, reducing overall yield. Thus, access to the solar cell is facilitated by extending the bottom and/or top contacts by adding an additional contact pad 404 (see FIG. 4—described below). In the example depicted in the figures, this additional contact pad 404 is used to access the back contact (via a through contact) as well as the metal grid 112 top contact. However, use of the additional contact pad 404 to separately access either the back contact or the metal grid 112 top contact can instead be implemented.

Figure 2:
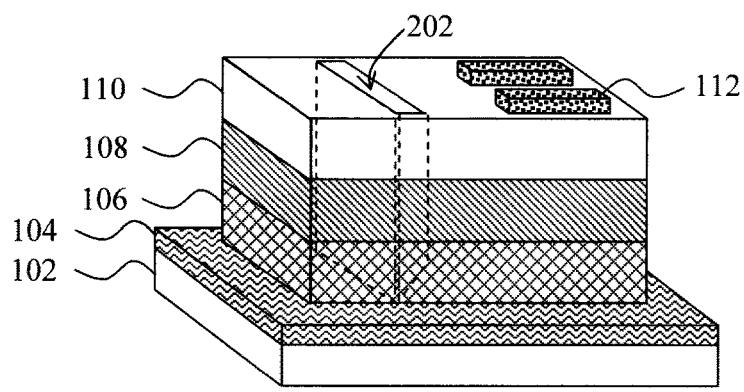
FIG. 2 is a cross-sectional diagram illustrating a via having been formed that passes through the stack of solar cell according to an embodiment of the present invention.

In order for the contact pad 404 to access the back contact, a via 202 is first created that passes through the stack of solar cell 100. Specifically, as shown in FIG. 2, via 202 extends down through the transparent front contact 110, the buffer layer 108, the absorber 106, and stops on the layer(s) of electrically conductive material 104. Since the substrate 102 and the layer(s) of electrically conductive material 104 will later be removed from the solar cell, the via 202 configured in this manner will provide access through the solar cell stack to the high work function back contact that replaces the substrate.

Via 202 can be created using a mechanical process to selectively remove a portion of the completed solar cell. For instance, by way of example only, a scalpel can be used to carefully cut through a section of the solar cell stack until the electrically conductive material 104 is visible through via 202 from the top.

Figure 3:
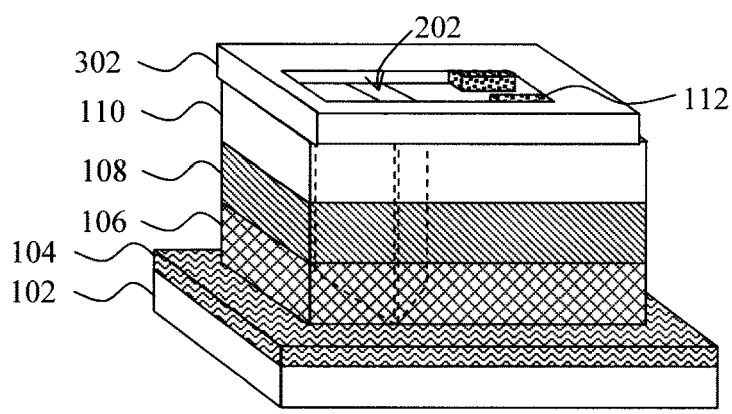
FIG. 3 is a cross sectional diagram illustrating a patterned mask having been formed on top of the solar cell, blocking the active areas of the solar cell, according to an embodiment of the present invention.
Figure 4:
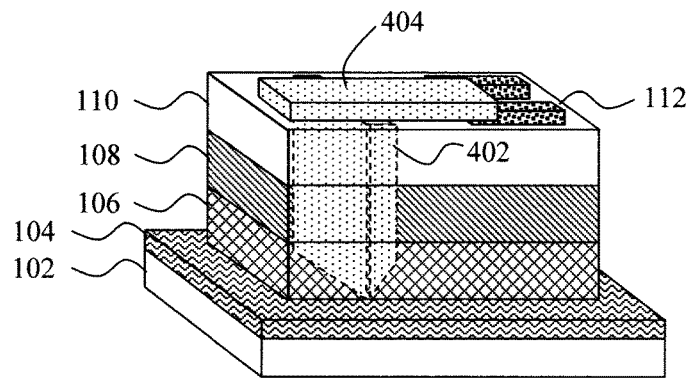
FIG. 4 is a cross sectional diagram illustrating a contact metal(s) having been deposited onto the solar cell through the mask forming a through contact in the via and a contact pad connecting the via to the metal grid according to an embodiment of the present invention.
Figure 5:
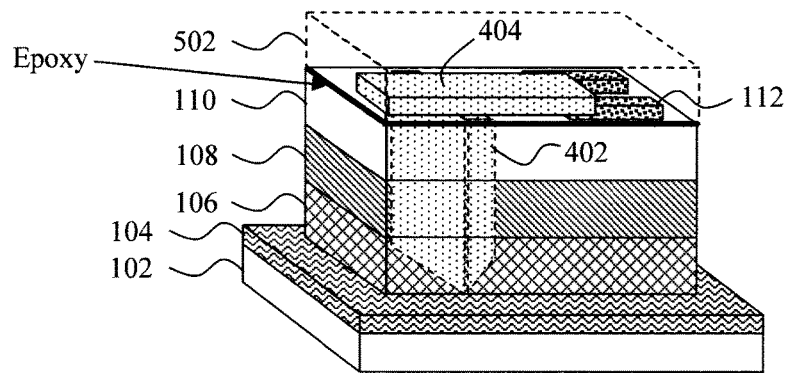
FIG. 5 is a cross sectional diagram illustrating a handle substrate having been attached to the top surface of the solar cell using, e.g., an adhesive, according to an embodiment of the present invention.

The next task is to deposit a contact metal(s) to form the contact pad 404. In this case, the deposited contact metal(s) will also fill the via 202, forming a through contact 402 in the via 202 (see FIG. 4). However, prior to depositing the contact metal(s), it is preferable to first mask the active device areas (i.e., those areas through which light is to pass to the absorber 106) preventing the deposited contact metal from covering these areas since the contact metal(s) are generally not transparent to light. Thus, as shown in FIG. 3, a mask 302 is formed over the solar cell 100 blocking all but those areas in which the contact pad 404 will be formed. According to an exemplary embodiment, standard lithography and etching techniques are employed to pattern the mask 302. However, any other suitable means for masking the active device areas can be employed. For instance, a glass microscope slide(s) can be positioned as the mask 302.

Next, a contact metal(s) is then deposited onto the solar cell 100 through the mask 302, including into (and filling the via 202). The contact metal(s) can be deposited using any suitable process including, but not limited to, evaporation or sputtering. The contact metal(s) will only be deposited on the surfaces of the solar cell 100 not covered by the mask 302. Suitable contact metal(s) include, but are not limited to, Ni and/or Al. Following deposition of the contact metal(s), the mask 302 can be removed, leaving behind a through contact 402 in the via 202 and a contact pad 404 connecting the through contact 402 to the metal grid 112. See FIG. 4. Any excess metal will be removed with mask 302 as in a lift-off process.

The solar cell is next separated from the substrate 102/electrically conductive material 104 using exfoliation techniques. In general, a handle substrate 502 (see FIG. 5) is attached to the top surface of the solar cell using, e.g., an adhesive, and exfoliation is used to separate the active layers of the solar cell from the substrate 102/electrically conductive material 104, which exposes the back side surface of the solar cell. As will be described in detail below, a variety of different exfoliation methods may be employed, such as mechanical or chemical exfoliation. In order to distinguish the handle substrate 502 from the substrate 102 on which the solar cell is fabricated, substrate 102 may also be referred to herein as a first substrate while handle substrate 502 may also be referred to herein as a second substrate.

Suitable handle substrates include, but are not limited to, glass substrates such as a fused silica plate. According to an exemplary embodiment, the handle substrate 502 is attached to the top surface of the solar cell using a transparent epoxy.

Preferably, the epoxy is processed in a manner to avoid/remove bubbles from the epoxy as bubbles can lead to holes and/or cracks forming in the cured epoxy which can cause shunting and contact issues. Specifically, the epoxy is prepared by mixing appropriate amounts of a resin and a hardener. The mixture will then cure over time. To avoid bubbles, it is preferable to mix the resin and the hardener under a vacuum to degas the mixture and thus avoid bubbling. Afterwards, the mixture is spun in a centrifuge to get rid of any macroscopic bubbles that have formed. See, for example, FIG. 9.

Figure 9:
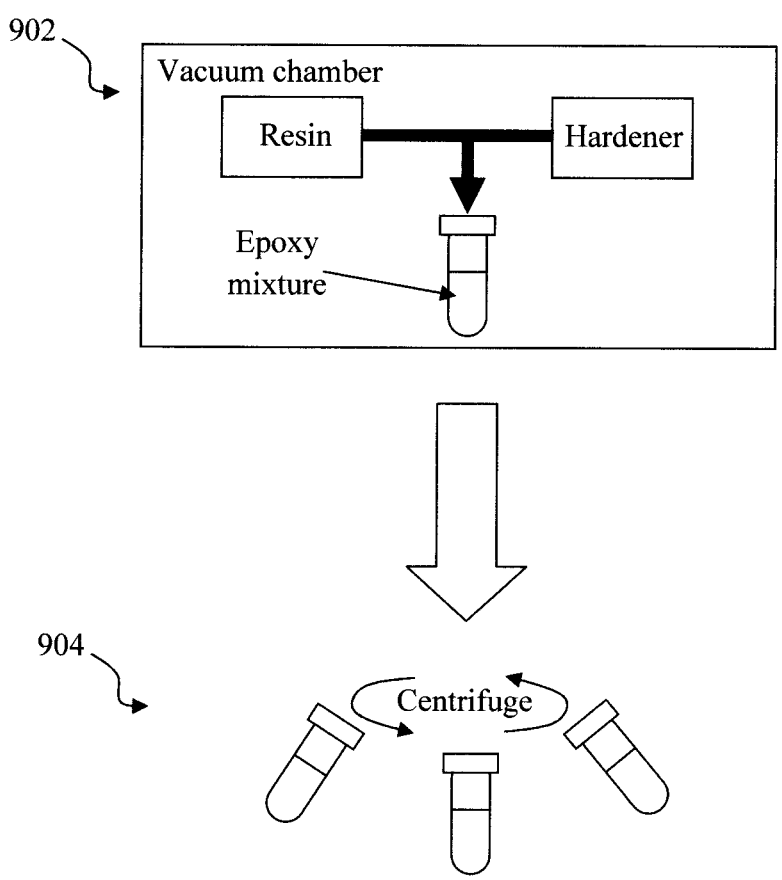
FIG. 9 is a diagram illustrating an exemplary methodology for producing a bubble-free epoxy according to an embodiment of the present invention.

Referring briefly to FIG. 9, as shown in step 902 the resin and hardener can be mixed in a vacuum chamber, under a vacuum, which will serve to degas the resulting epoxy mixture. Next, as shown in step 904, a centrifuge can be used to remove most or all remaining macroscopic bubbles from the epoxy mixture. For instance, following this processing, the epoxy will not contain any bubbles greater than 10 nanometers in diameter, and might in fact be bubble free. As a result of this process, pinholes on the exposed back surface of the device will be reduced in number or eliminated altogether. See below.

Referring back to FIG. 5, the (bubble-free or virtually bubble-free) epoxy is applied to the top surface of the solar cell, followed by the handle substrate 502. After the epoxy has cured, the handle substrate 502 will be affixed to the top surface of the solar cell. With the handle substrate 502 in place, the solar cell can then be removed/separated from the substrate 102/electrically conductive material 104. See, for example, FIG. 6.

Figure 6:
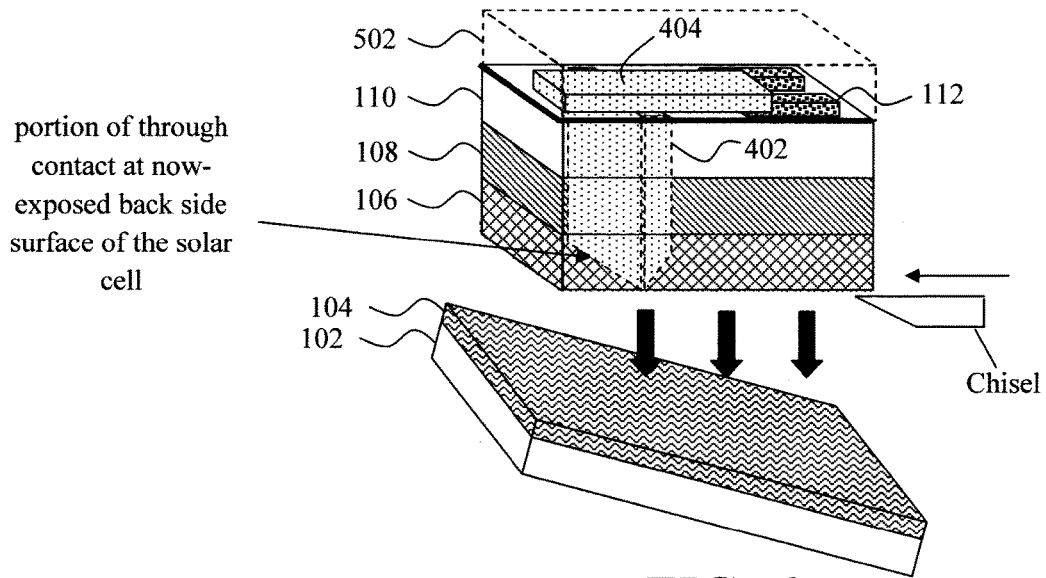
FIG. 6 is a cross-sectional diagram illustrating the substrate/electrically conductive material having been separated (exfoliated) from the solar cell according to an embodiment of the present invention.
Figure 7:
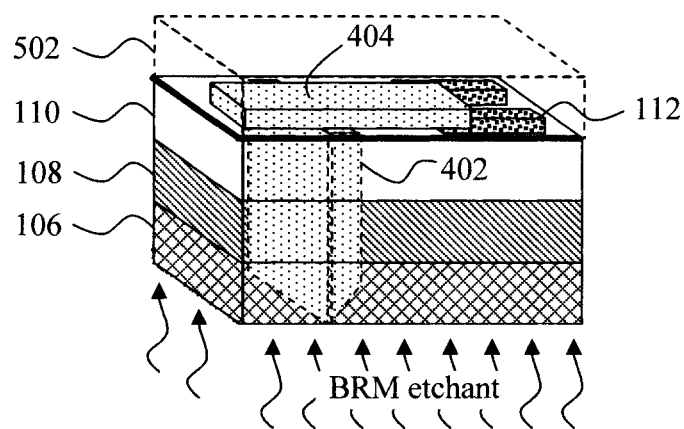
FIG. 7 is a cross-sectional diagram illustrating the back side surface of the solar cell (i.e., the exposed surface of the absorber) having been smoothed according to an embodiment of the present invention.
Figure 8:
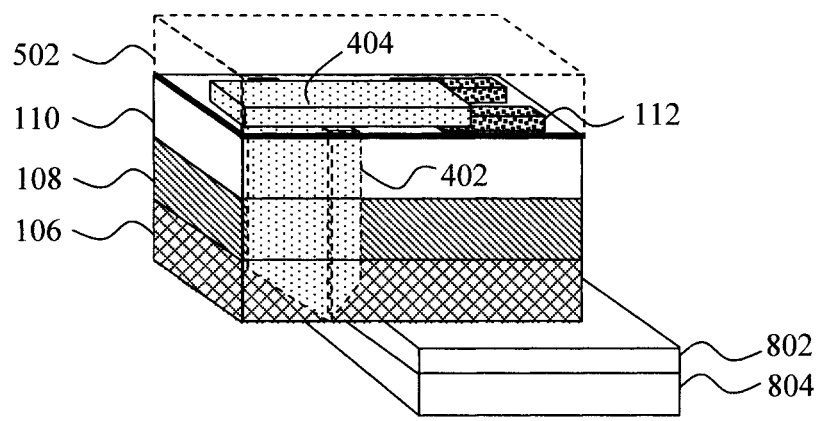
FIG. 8 is a cross-sectional diagram illustrating a high work function material having been deposited onto the back side surface of the solar cell, followed by a back contact being deposited onto the high work function material according to an embodiment of the present invention.

As shown in FIG. 6, the stack is cleaved at the juncture of the absorber 106 and the electrically conductive material 104 effectively removing (via exfoliation) the substrate 102/electrically conductive material 104 from the solar cell. According to an exemplary embodiment, a mechanical exfoliation process is used. For instance, a hammer and chisel can be employed whereby the blade of the chisel is placed at the juncture and the chisel struck with the hammer causing a separation of the layers. Alternatively, other exfoliation methods can be employed, such as chemical or thermal exfoliation. See, for example, Pachauri et al., "Chemically exfoliated large-area two-dimensional flakes of molybdenum disulfide for device applications," APL MATERIALS 1, 032102 (September 2013) (10 pages), the contents of which are incorporated by reference as if fully set forth herein. Thermal exfoliation is described, for example, in U.S. Patent Application Publication Number 2016/0204304 by Gunawan et al., entitled "Substrate-Free Thin-Film Flexible Photovoltaic Device and Fabrication Method," the contents of which are incorporated by reference as if fully set forth herein.

Having a bubble-free (or virtually bubble-free) epoxy for the exfoliation process is a notable advantage. Specifically, wherever a bubble exists there is no epoxy. Therefore, during exfoliation the materials in those bubble regions without the epoxy do not separate properly from the substrate, i.e., they remain attached to the substrate. This translates to pinholes/gaps through the stack of materials that have been exfoliated from the substrate. Any subsequently deposited material, such as the back contact (see below) can make its way into the pinholes/gaps causing shunting and contact issues.

Separation of the substrate 102/electrically conductive material 104 from the solar cell exposes a back side surface of the solar cell, onto which a high work function back contact will be formed. The back side surface of the solar cell is composed of a side of the absorber 106 opposite the buffer layer 108. Also present at the (now-exposed) back side surface of the solar cell is a strip of the through contact 402.

However, prior to forming the back contact it is preferable to first smooth the back side surface of the solar cell. See FIG. 7. According to an exemplary embodiment, a wet etchant such as bromine methanol (BRM) is used. See FIG. 7. More particularly, a wet etch with a BRM solution containing from about 5% $Br_2$ to about 20% $Br_2$, and ranges therebetween, for a duration of from about 10 seconds (s) to about 20 s, and ranges therebetween, is preferred. A wet etch of the back side surface of the solar cell also improves device performance by eliminating secondary phases and/or removing degraded portions of the absorber 106. The use of BRM to remove surface residue is described, for example, in Hegedus et al., "CdTe contacts for CdTe/CdS solar cells: effect of Cu thickness, surface preparation and recontacting on device performance and stability," Solar Energy Materials & Solar Cells 88, 75-79 (2005), the contents of which are incorporated by reference as if fully set forth herein. While helpful to boost efficiency parameters, this wet etch is not required to obtain quality devices. In fact, it might be beneficial to forgo this etch altogether in the case of thinner devices for which the etch might be too aggressive.

A high work function material 802 is then deposited onto the back side surface of the solar cell (i.e., onto the exposed surface of the absorber 106), followed by a back contact 804 being deposited onto the high work function material 802. See FIG. 8. An optional passivating layer (e.g., sulfur, selenium and/or tellurium) can be placed before deposition of the high work function material 802 to reduce electron-hole recombination at the back contact. See, for example, U.S. patent application Ser. No. 15/281,789 filed by Antunez et al., entitled "Chalcogen Back Surface Field Layer," the contents of which are incorporated by reference as if fully set forth herein.

According to an exemplary embodiment, the high work function material is $MoO_2$. By comparison with molybdenum trioxide ($MoO_3$), $MoO_2$ has a higher conductivity and together with improved Voc's, fill factor (FF) properties of the solar cell can be improved. The high work function material 802 can be deposited onto the back side surface of the solar cell using a process such as evaporation or sputtering. Suitable contact materials for the back contact 804 include, but are not limited to, metals such as gold (Au), platinum (Pt), and/or silver (Ag). The back contact 804 can be formed on the high work function material 802 using any suitable deposition process including, but not limited to, vacuum deposition, sputtering, or electroplating.

Figure 10:
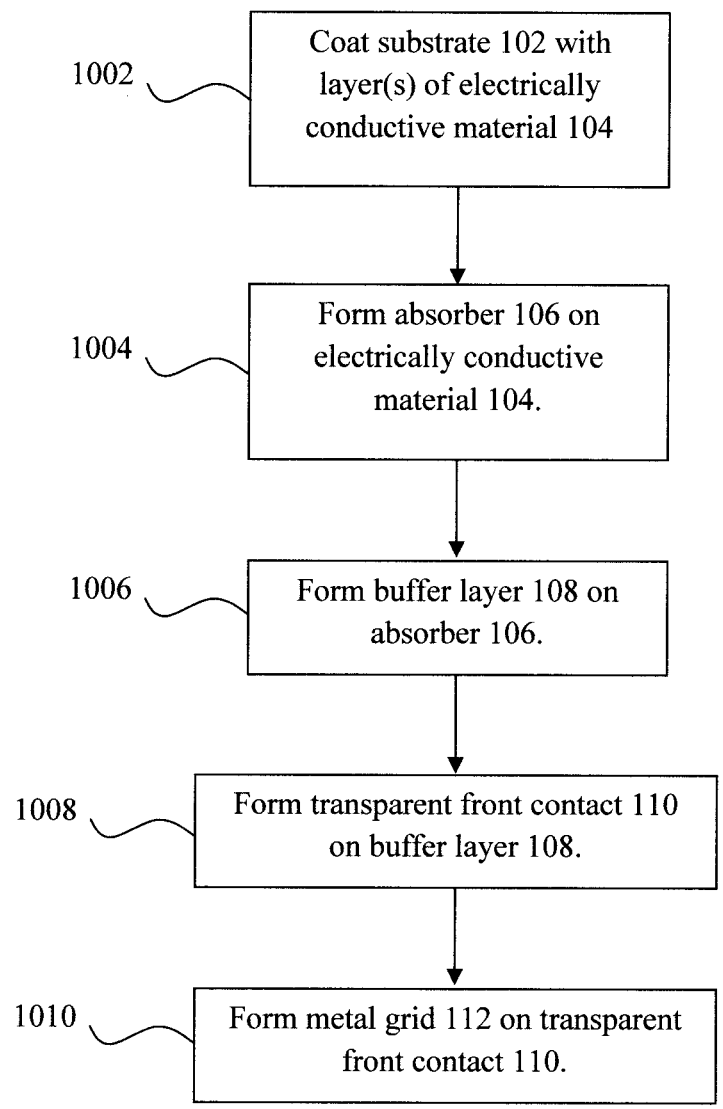
FIG. 10 is a diagram illustrating an exemplary methodology for forming the present solar cells according to an embodiment of the present invention.

FIG. 10 is a diagram illustrating an exemplary methodology 1000 for forming a solar cell, such as the (completed) solar cell depicted in FIG. 1, and described above. As such, the same structures are numbered alike in the following description. In step 1002, the substrate 102 is coated with a layer(s) of an electrically conductive material 104. As provided above, suitable substrates 102 include, but are not limited to, SLG, ceramic, metal foil, or plastic substrates, and suitable electrically conductive materials 104 include, but are not limited to, Mo, Ni, Ta, W, Al, Pt, TiN, SiN, and combinations thereof. In general, the various layers of the device will be deposited sequentially using a combination of vacuum-based and/or solution-based approaches. For example, the electrically conductive material 104 can be deposited onto the substrate 102 using evaporation or sputtering.

Next, in step 1004 the absorber 106 is formed on the electrically conductive material 104. According to an exemplary embodiment, the absorber 106 is a CZT(S,Se) absorber which includes Cu, Zn, Sn, and at least one of S and Se. A CZT(S,Se) absorber 106 can be formed using vacuum-based, solution-based, or other suitable approaches to form a stack of layers. See for example U.S. Pat. No. 8,426,241 by Ahmed et al., entitled "Structure and Method of Fabricating a CZTS Photovoltaic Device by Electrodeposition," the contents of which are incorporated by reference as if fully set forth herein. The sequence of the layers in the stack can be configured to achieve optimal band grading and/or adhesion to the substrate. See, for example, Dullweber et al., "Back surface band gap gradings in Cu(In,Ga)Se$_2$ solar cells," Thin Solid Films, vol. 387, 11-13 (May 2001), the contents of which are incorporated by reference as if fully set forth herein.

Suitable solution-based kesterite fabrication techniques are described, for example, in Wang et al., "Device Characteristics of CZTSSe Thin-Film Solar Cells with 12.6% Efficiency," Adv. Energy. Mater. (November 2013) (5 pages) and in U.S. Patent Application Publication Number 2013/0037111 by Mitzi et al., entitled "Process for Preparation of Elemental Chalcogen Solutions and Method of Employing Said Solutions in Preparation of Kesterite Films," the contents of both of which are incorporated by reference as if fully set forth herein. Suitable particle-based precursor approaches for CZT(S,Se) formation are described, for example, in U.S. Patent Application Publication Number 2013/0037110 by Mitzi et al., entitled "Particle-Based Precursor Formation Method and Photovoltaic Device Thereof," the contents of which are incorporated by reference as if fully set forth herein.

During formation of the (e.g., CZT(S,Se)-based) absorber 106, S and Se can be introduced via separately regulated (valve controlled) sources to control the ratio of S to Se in the absorber 106. See, for example, U.S. Patent Application Publication Number 2012/0100663 filed by Bojarczuk et al., entitled "Fabrication of CuZnSn(S,Se) Thin Film Solar Cell with Valve Controlled S and Se," the contents of which are incorporated by reference as if fully set forth herein. For instance, pure sulfur (sulfide) would produce a CZT(S) absorber with a band gap of about 1.5 electron volts (eV) whereas pure selenium (selenide) would produce a CZT(Se) absorber with a band gap of about 0.96 eV. According to an exemplary embodiment, the absorber 106 has an S:Se ratio of from about 0.05 to about 0.95, and ranges therebetween.

Since the as-deposited materials have poor grain structure and a lot of defects, following deposition of the absorber materials a high temperature (for example from about 400° C. to about 650° C. and ranges therebetween, e.g., from about 590° C. to about 645° C. and ranges therebetween) post anneal in a chalcogen environment is preferably performed. For instance, an anneal in a chalcogen (e.g., S and/or Se) environment improves the grain structure and defect landscape in a CZT(S,Se) absorber material. According to an exemplary embodiment, the anneal is performed at a temperature of from about 500 degrees Celsius (° C.) to about 600° C., and ranges therebetween, to form a film composed of polycrystalline grains of from 1 μm to about 2 μm, and ranges therebetween, in size. Grain size is measured herein as the greatest length of the grain when viewed in cross-section. Performing the anneal in a chalcogen environment provides another opportunity to tune the S:Se ratio in the absorber material, if so desired. Specifically, being volatile species, S and Se will evaporate from the film during the anneal. The chalcogen environment serves to replace these volatiles. Thus, the final S:Se ratio in the film can be controlled by regulating a S:Se ratio in the chalcogen environment during the anneal.

In step 1006, the buffer layer 108 is formed on the absorber 106. As provided above, suitable materials for the buffer layer 108 include, but are not limited to, CdS, a cadmium-zinc-sulfur material of the formula $Cd_{1-x}Zn_xS$ (wherein 0<x≤1), In$_2$S$_3$, zinc oxide, zinc oxysulfide (e.g., a Zn(O,S) or Zn(O,S,OH) material), and/or Al$_2$O$_3$. According to an exemplary embodiment, the buffer layer 108 is deposited on the absorber 106 using standard chemical bath deposition.

In step 1008, the transparent front contact 110 is formed on the buffer layer 108. As provided above, suitable materials for the transparent front contact 110 include, but are not limited to, TCOs such as ITO and/or AZO. According to an exemplary embodiment, the transparent front contact 110 is formed on the buffer layer 108 by sputtering.

In step 1010, a metal grid 112 is formed on the transparent front contact 110. As provided above, suitable materials for forming the metal grid 112 include, but are not limited to, Ni and/or Al. According to an exemplary embodiment, the metal grid 112 is formed on the transparent front contact 110 using evaporation or sputtering.

Figure 11:
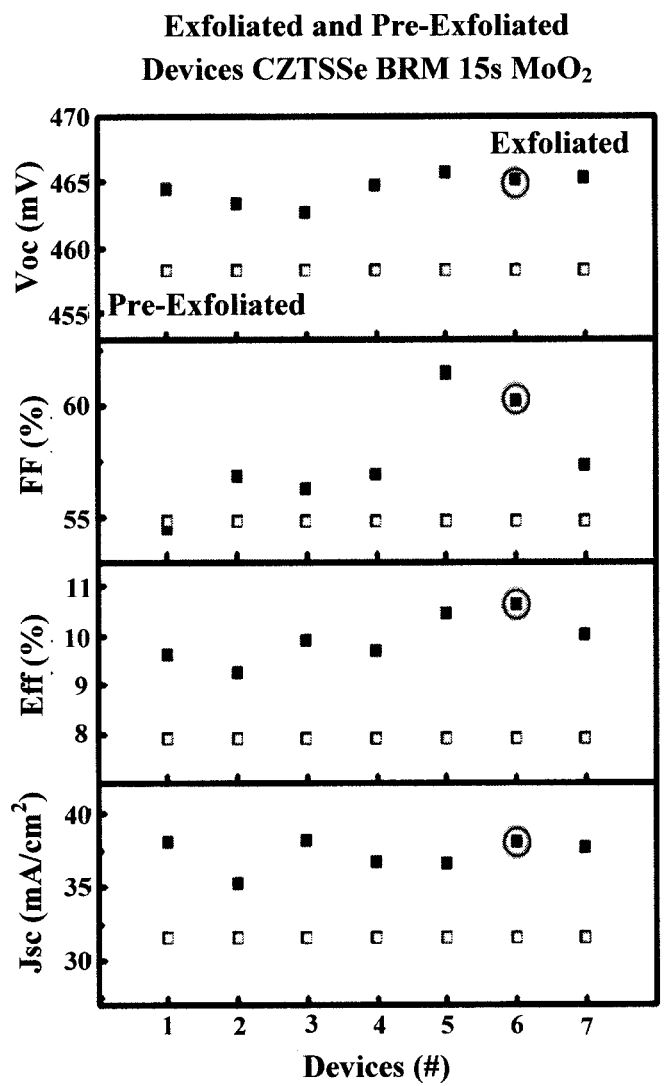
FIG. 11 is a diagram illustrating performance of devices prepared using the present techniques as compared to the same devices prior to exfoliation according to an embodiment of the present invention.

The present techniques are now further described by way of reference to the following non-limiting examples. FIG. 11 is a diagram illustrating devices (#1-7) prepared using the present techniques (labeled "Exfoliated") versus the same devices prior to exfoliation, wet etch, high work function contact formation, etc. (labeled "Pre-Exfoliation"). Specifically, the "Exfoliated" devices have been separated (exfoliated) from the original substrate/back contact, the back side surface (i.e., exposed absorber) has been etched in BRM for 15 seconds (s), and a MoO$_2$ high work function material has been deposited onto the exposed back side surface. The "Pre-Exfoliated" devices have not undergone this processing, and represent the devices just prior to exfoliation. All devices tested were CZT(S,Se)-based solar cells. As shown in FIG. 11, all "Exfoliated" devices outperformed their "Pre-Exfoliated" counterparts in terms of open circuit current (Voc), fill factor (FF), efficiency (Eff), and open circuit current (Jsc), with the highest performing device (device #6) having an efficiency of 10.6%, a fill factor (FF) of 60.1%, an open circuit current (Voc) of 465 millivolts (mV), and an open circuit current (Jsc) of 38 milliamps per square centimeter (mA/cm$^2$).

Figure 12:
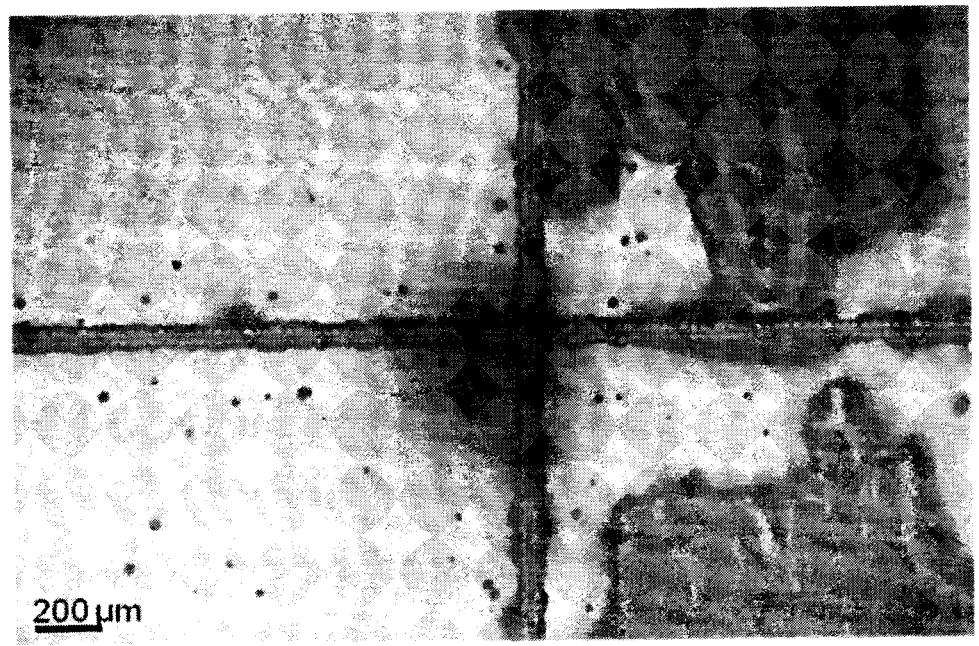
FIG. 12 is an image of a solar cell prepared without degassing of the epoxy used for exfoliation according to an embodiment of the present invention.
Figure 13:
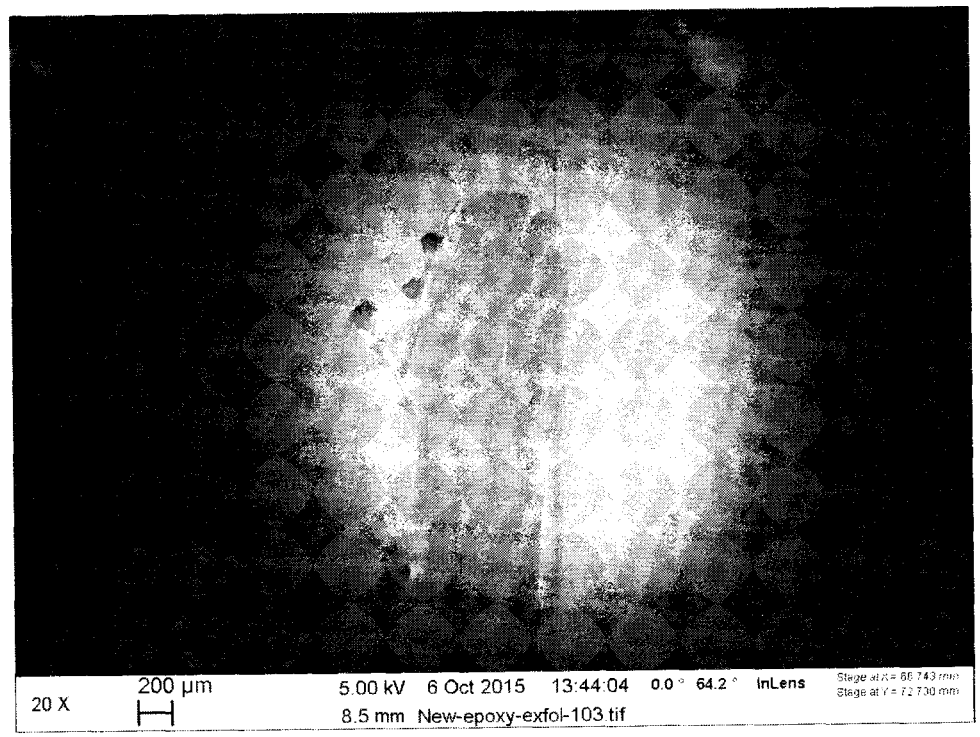
FIG. 13 is an image of a solar cell prepared with degassing of the epoxy according to an embodiment of the present invention.

As described above, it is preferable to degas the epoxy used to attach the handle substrate to the solar cell as bubbles from the epoxy can lead to holes and/or cracks forming in the cured epoxy which can cause shunting and contact issues. See, for example, FIGS. 12 and 13 which illustrate sample solar cells prepared without (FIG. 12) and with (FIG. 13) degassing. As provided above the epoxy can be degassed through its mixing under vacuum and centrifugation to remove any remaining bubbles. The sample shown in FIG. 12 contains quite a few pinholes, while the sample in FIG. 13 is virtually pinhole-free.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a solar cell, the method comprising:
    forming a completed solar cell comprising a substrate coated with an electrically conductive material, an absorber disposed on the electrically conductive material, a buffer layer disposed on the absorber, a transparent front contact disposed on the buffer layer, and a metal grid disposed on the transparent front contact;
    removing the substrate and the electrically conductive material using exfoliation, exposing a backside surface of the solar cell;
    after the substrate and the electrically conductive material have been removed, depositing a high work function material onto the back side surface of the solar cell; and
    after the high work function material has been deposited onto the back side surface of the solar cell, depositing a back contact onto the high work function material.

2. The method of claim 1, wherein the absorber comprises copper, zinc, tin, and at least one of sulfur and selenium.

3. The method of claim 1, wherein the absorber has a thickness of from about 0.5 µm to about 2 µm, and ranges therebetween.

4. The method of claim 1, wherein the high work function material comprises molybdenum dioxide.

5. The method of claim 1, wherein the back contact comprises a metal selected from the group consisting of: gold, platinum, silver, and combinations thereof.

6. The method of claim 1, further comprising:
    attaching a handle substrate to a top surface of the solar cell.

7. The method of claim 6, wherein the handle substrate comprises a fused silica plate.

8. The method of claim 6, wherein the handle substrate is attached to the top surface of the solar cell using an epoxy, the method further comprising:
    preparing the epoxy under a vacuum to prevent formation of bubbles in the epoxy.

9. The method of claim 8, further comprising:
    spinning the epoxy in a centrifuge to remove bubbles from the epoxy.

10. The method of claim 1, further comprising:
    forming a via in the solar cell by selectively removing a portion of the solar cell down to the electrically conductive material.

11. The method of claim 10, further comprising:
    forming a patterned mask on a top surface of the solar cell; and
    depositing a contact metal, through the patterned mask, into the via forming a through contact in the via.

12. The method of claim 11, wherein the contact metal is selected from the group consisting of: nickel and aluminum.

13. The method of claim 11 further comprising:
    depositing the contact metal, through the patterned mask, forming a contact pad on the transparent front contact connecting the through contact to the metal grid.

14. The method of claim 1, further comprising:
    smoothing the backside surface of the solar cell after the substrate and the electrically conductive material have been removed.

15. The method of claim 14, wherein the smoothing is performed using a wet etch.

16. The method of claim 15, wherein the wet etch comprises bromine methanol.

17. The method of claim 1, wherein the transparent front contact comprises a single layer of aluminum (Al)-doped zinc oxide (ZnO) (AZO) disposed directly on the buffer layer.

* * * * *